(12) United States Patent
Park et al.

(10) Patent No.: US 9,590,662 B2
(45) Date of Patent: Mar. 7, 2017

(54) INTEGRATED ANTENNA AND SENSOR ELEMENT APPARATUS FOR A PORTABLE WIRELESS TERMINAL

(71) Applicant: Samsung Electronics Co., Ltd., Gyeonggi-do (KR)

(72) Inventors: Gyu-Bok Park, Gyeonggi-do (KR); Hee-Jun Lee, Gyeonggi-do (KR); Cheol-Hong Son, Seoul (KR); Austin Kim, Gyeonggi-do (KR); Joon-Ho Byun, Gyeonggi-do (KR); Se-Hyun Park, Gyeonggi-do (KR); Seong-Tae Jeong, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/864,160

(22) Filed: Sep. 24, 2015

(65) Prior Publication Data
US 2016/0013817 A1    Jan. 14, 2016

Related U.S. Application Data

(63) Continuation of application No. 13/441,992, filed on Apr. 9, 2012, now Pat. No. 9,231,293.

(30) Foreign Application Priority Data

Jul. 27, 2011 (KR) .................. 10-2011-0074503

(51) Int. Cl.
*H04B 1/00* (2006.01)
*H04B 15/00* (2006.01)
(Continued)

(52) U.S. Cl.
CPC ............ *H04B 1/0053* (2013.01); *H01Q 1/243* (2013.01); *H01Q 1/44* (2013.01); *H01Q 9/42* (2013.01);
(Continued)

(58) Field of Classification Search
CPC .......... H01Q 1/242; H01Q 1/243; H01Q 3/24; H01Q 1/24; H04B 7/0814; H04B 1/3838;
(Continued)

(56) References Cited

U.S. PATENT DOCUMENTS

| | | |
|---|---|---|
| 6,456,856 B1 | 9/2002 | Werling et al. |
| 6,985,113 B2 * | 1/2006 | Nishimura ............ H01Q 1/245 343/700 MS |

(Continued)

FOREIGN PATENT DOCUMENTS

| | | |
|---|---|---|
| EP | 0 977 304 A1 | 2/2000 |
| JP | 2005-269090 A | 9/2005 |

(Continued)

OTHER PUBLICATIONS

Myllymaki, S, et al.; "Method for Measuring User-Induced Load on Mobile Terminal Antenna;" Electronic Letters, The Institution of Engineering and Technology, vol. 45, No. 21; Oct. 8, 2009; pp. 1065-1066; XP006034016.

(Continued)

*Primary Examiner* — Pablo Tran
(74) *Attorney, Agent, or Firm* — Cha & Reiter, LLC

(57) ABSTRACT

An apparatus interworking with a metal member used both as an antenna and a sensor element in a portable terminal is disclosed. The apparatus includes the metal member, responsive to a sensed body, and for transmitting and receiving a signal in at least one or more communication service bands, and a main board having a communication module for processing a signal transmitted and received by the metal (Continued)

member and a sensor module for obtaining information in response to the approach of a sensed body.

18 Claims, 14 Drawing Sheets

(51) Int. Cl.
*H04B 1/38* (2015.01)
*H01Q 1/24* (2006.01)
*H01Q 1/44* (2006.01)
*H03K 17/955* (2006.01)
*H01Q 9/42* (2006.01)
*H04B 1/3827* (2015.01)
*H04W 52/24* (2009.01)
*H04W 52/28* (2009.01)
*H03K 17/96* (2006.01)
*H04W 88/06* (2009.01)

(52) U.S. Cl.
CPC ......... *H03K 17/955* (2013.01); *H04B 1/3838* (2013.01); *H04B 15/00* (2013.01); *H04W 52/243* (2013.01); *H04W 52/283* (2013.01); *H03K 2017/9606* (2013.01); *H03K 2217/960755* (2013.01); *H04W 88/06* (2013.01)

(58) Field of Classification Search
CPC .......... H04B 7/0608; H04B 1/38; H04B 5/00; H04M 1/00
USPC ...... 455/41.1, 41.2, 41.3, 550.1, 90.3, 575.1, 455/575.5, 575.6, 562.1, 575.7; 343/872; 379/388
See application file for complete search history.

(56) References Cited

U.S. PATENT DOCUMENTS

| | | | |
|---|---|---|---|
| 7,113,087 B1 | 9/2006 | Casebolt et al. | |
| 7,937,124 B2* | 5/2011 | Chung | H04B 1/3838 343/846 |
| 8,059,702 B2* | 11/2011 | Young | H04L 12/66 375/222 |
| 8,159,399 B2* | 4/2012 | Dorsey | H01Q 1/2266 343/702 |
| 8,577,289 B2 | 11/2013 | Schlub et al. | |
| 8,629,771 B2* | 1/2014 | Anderson | G01S 5/0018 340/552 |
| 8,781,420 B2* | 7/2014 | Schlub | H01Q 1/243 455/115.1 |
| 8,954,121 B2* | 2/2015 | Kanj | H01Q 1/242 455/575.7 |
| 8,995,938 B2* | 3/2015 | Ali | H04B 1/3838 455/127.1 |
| 2002/0094789 A1 | 7/2002 | Harano | |
| 2007/0238496 A1 | 10/2007 | Chung et al. | |
| 2009/0305742 A1 | 12/2009 | Caballero et al. | |
| 2011/0012790 A1 | 1/2011 | Badaruzzaman et al. | |
| 2011/0012793 A1 | 1/2011 | Amm et al. | |
| 2011/0043227 A1 | 2/2011 | Pance et al. | |
| 2011/0250928 A1 | 10/2011 | Schlub et al. | |
| 2012/0154245 A1* | 6/2012 | Nagumo | H01Q 1/243 343/861 |
| 2012/0235635 A1 | 9/2012 | Sato | |
| 2013/0135157 A1 | 5/2013 | Tsou et al. | |

FOREIGN PATENT DOCUMENTS

| | | |
|---|---|---|
| JP | 2005-323072 A | 11/2005 |
| JP | 2008-294635 A | 12/2008 |
| JP | 2009-296483 A | 12/2009 |
| WO | 2009/149023 A1 | 12/2009 |
| WO | 2011/024506 A1 | 3/2011 |
| WO | 2011/129983 A2 | 10/2011 |
| WO | 2012/112275 A1 | 8/2012 |

OTHER PUBLICATIONS

Myllymaki, S, et al.;"Capacitive Recognition of the User's Hand Grip Position in Mobile Handsets;" Progress in Electromagnetics Research B, Electromagnetics Academy,US; The Institution of Electrical Engineers, Stevenage, GB, vol. 22, Jan. 1, 2010; pp. 203-220; XP002675338.

European Auxiliary Notice of Allowance dated Mar. 31, 2016.
Japanese Notice of Patent Grant, dated Aug. 23, 2016.
Chinese Notice of Patent Grant, dated Nov. 1, 2016.

\* cited by examiner

INTEGRATED ANTENNA AND SENSOR ELEMENT APPARATUS FOR A PORTABLE WIRELESS TERMINAL

CROSS REFERENCE TO RELATED APPLICATIONS

This is a Continuation application of U.S. patent application Ser. No. 13/441,992 filed Apr. 9, 2012 which claims, pursuant to 35 U.S.C. §119(a), priority to, and the benefit of the earlier filing date of, that patent application filed in the Korean Intellectual Property Office on Jul. 27, 2011 and assigned Serial No. 10-2011-0074503, the entire disclosure of which is hereby incorporated by reference.

BACKGROUND

1. Field of the Invention

The present invention relates to a portable wireless terminal and particularly, to a combined antenna and sensor element used in a portable terminal 2. Description of the Related Art With the development of electronics communication industries in recent years, electronic devices, such as a mobile communication terminal, a cellular phone), an electronics organizer, a Personal Digital Assistant (PDA), etc., have become a necessity of modern life. In response to the demand for portable terminals or mobile communication devices, portable terminals have become lighter in weight and smaller in size while the number of functions or operations that the devices and terminals performs have increased dramatically.

However, with the reduced sized of the portable terminals, it becomes more difficult to mount several necessary elements in the limited space of the portable terminal. For example, as the portable terminals become increasing slimmer, the space for installing necessary components, without causing interference between the components (or elements), has become a significant factor in the performance of the portable terminals.

FIG. 1 illustrates an exemplary arrangement of elements of a conventional portable wireless terminal 100. Referring to FIG. 1, the portable wireless terminal 100 includes a case frame 110 for forming an external appearance and having elements as described below. The portable wireless terminal 100 can include a sensor element 140 and at least one or more antennas 130 and 150 mounted on a main board 120. The sensor element 140 may for example represent a proximity sensor that senses the presence of an object (e.g., a user's body) close to the portable terminal. The sensor element 140 typically includes a metal plate whose electrostatic capacitance varies depending on a distance between the metal plate and the sensed object (or body).

Generally, the size of the antennas 130 and 150 determines the performance of the antenna. The larger the size of the antenna is, the better the performance of the antenna, and the portable terminal Further, the greater the size of the metal plate used as a sensor element the better the performance and/or sensitivity of the sensor element.

However, in a situation where several elements are mounted together in a limited space, it is difficult to ensure performance while avoiding interference between the elements.

SUMMARY

An aspect of the present invention is to solve at least the above-mentioned problems and/or disadvantages and to provide at least the advantages described below. Accordingly, an aspect of the present invention is to provide an apparatus for ensuring a mount space by replacing several mount elements with one element in a portable wireless terminal and, thus, saving a manufacturing cost.

Another aspect of the present invention is to provide a metal member used both as an antenna and a sensor element in a portable wireless terminal and an apparatus for ensuring antenna performance and sensor performance by interworking with the metal member.

Another aspect of the present invention is to provide a metal member used both as an antenna and an element for a proximity sensor in a portable wireless terminal and an apparatus for reducing a Specific Absorption Rate (SAR) by decreasing power supplied to an antenna when it is detected that an object (e.g., a user's body) approaches close to the metal member.

In accordance with the present invention, an apparatus interworking with a metal member used both as an antenna and a sensor element is provided. The apparatus comprises a metal member, responsive to a sensed body, and for transmitting and receiving a signal in at least one or more communication service bands, and a main board having a communication module for processing a signal transmitted and received by the metal member and a sensor module for obtaining information corresponding to the sensed body from the metal member.

In accordance with the present invention, the apparatus is generally characterized in that the metal member has a first node electrically connected to the communication module and a second node electrically connected to the sensor module.

BRIEF DESCRIPTION OF THE DRAWINGS

The above and other aspects, features and advantages of certain exemplary embodiments of the present invention will be more apparent from the following detailed description taken in conjunction with the accompanying drawings, in which.

DETAILED DESCRIPTION

Exemplary embodiments of the present invention will be described with reference to the accompanying drawings. In the following description, well-known functions or constructions are not described in detail since they would obscure the invention in unnecessary detail. Also, the terms used herein are defined according to the functions of the present invention. Thus, the terms may vary depending on a user's or operator's intension and usage. Thus, the terms used herein must be understood based on the descriptions made herein.

Also, terms described herein, which are defined considering the functions of the present invention, may be implemented differently depending on user and operator's intention and practice. Therefore, the terms should be understood on the basis of the disclosure throughout the specification. The principles and features of this invention may be employed in varied and numerous embodiments without departing from the scope of the invention.

Furthermore, although the drawings represent exemplary embodiments of the invention, the drawings are not necessarily to scale and certain features may be exaggerated or omitted in order to more clearly illustrate and explain the present invention.

Among the terms set forth herein, a portable terminal (or terminal) refers to any kind of device capable of processing data that is transmitted or received to or from any external entity. The terminal may display icons or menus on a screen to which stored data and various executable functions are assigned or mapped. The terminal may represent a computer, a notebook, a tablet PC, a mobile device, and the like.

The present invention relates to a portable wireless terminal. More particularly, the present invention relates to ensuring a mount space by integrating several elements as one element and further providing saving in manufacturing cost by using a single element. According to an exemplary embodiment of the present invention, a metal member is used both as an antenna and a sensor element, and an apparatus interworking with the metal member in the portable wireless terminal.

Figure 1:
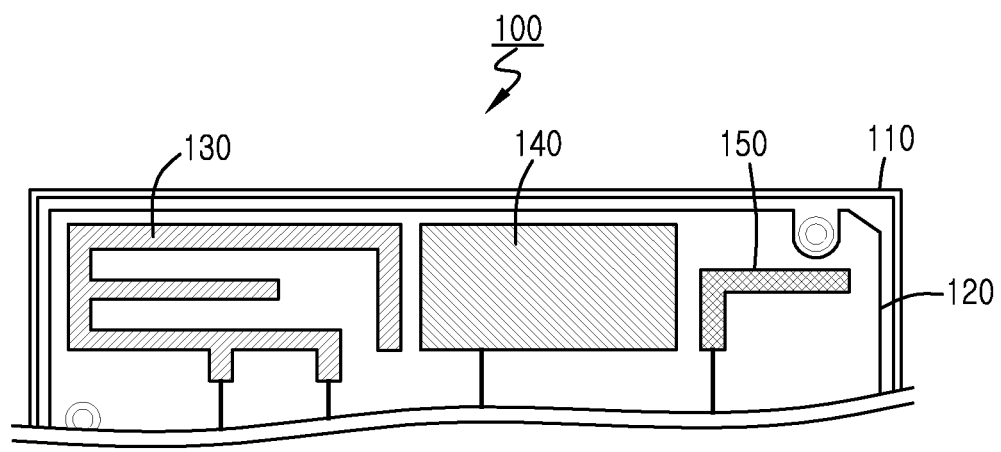
FIG. 1 illustrates an exemplary arrangement of elements of a conventional portable wireless terminal.
Figure 2:
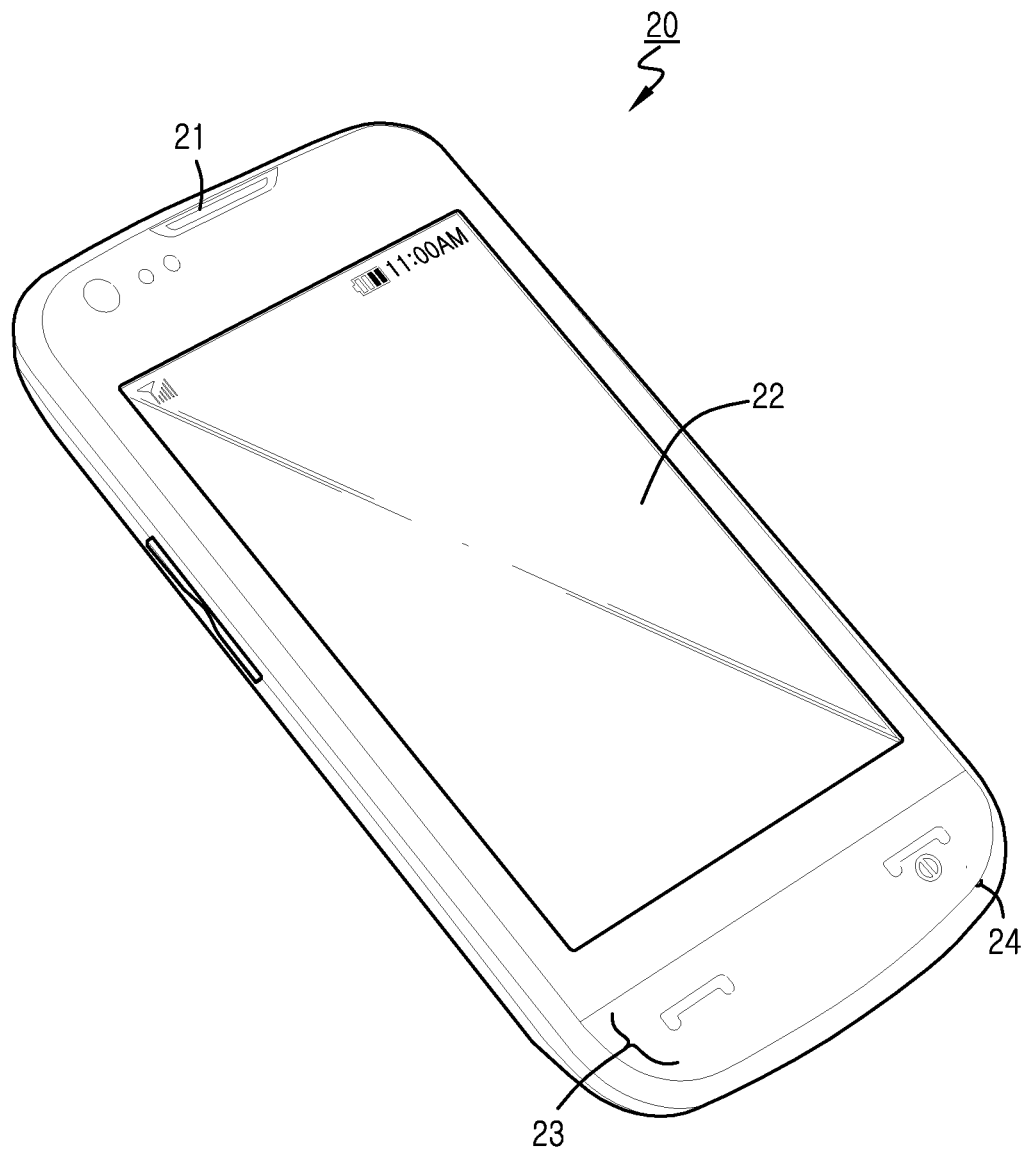
FIG. 2 is a perspective view of a portable wireless terminal.

FIG. 2 is a perspective view of a portable wireless terminal according to an exemplary embodiment of the present invention. The portable wireless terminal includes one metal member (not shown) used both as an antenna and a sensor element.

Referring to FIG. 2, the portable wireless terminal 20 includes a speaker 21 for outputting an audio signal and a display 22, located below the speaker 21, for outputting a video signal. Further, the portable wireless terminal 20 includes a keypad assembly 23 that may be used as a data input means and a microphone 24, located to the right of the keypad assembly 23, for inputting an audio signal. The display 22 may be a Liquid Crystal Display (LCD) having millions of pixels. Furthermore, the LCD may have a touch screen capability that enables the display 22 to operate as a data input unit. The touch screen may operate in conjunction with or instead of the keypad assembly 23. Touch screen technology is well-known in the art and need not be discussed in detail herein.

The portable wireless terminal 20 according to the exemplary embodiment of the present invention can include at least one or more antennas for transmitting and receiving signals in a specific communication service band (not shown). Further, the portable wireless terminal 20 can include at least one or more sensors (not shown). The sensor can be one that is responsive to the presence of an object (i.e., a sensed body) close to the portable terminal. For example, an electrostatic capacitance-type proximity sensor or touch sensor requires a metal plate whose electrostatic capacitance varies depending on a distance to the object approaching the metal plate (i.e., a conductor). Further, a resistance-type humidity sensor, thermal sensor, or the like requires a metal plate whose resistance varies depending on a temperature change.

In particular, the portable wireless terminal 20 according to the exemplary embodiment of the present invention includes one metal member used both as an antenna and a sensor element. That is, the metal member can transmit or receive a signal in at least one or more communication service bands, and can be responsive to at least one or more sensed bodies, wherein the response may be associated with one of a conductor, humidity, heat, etc.

Figure 3:
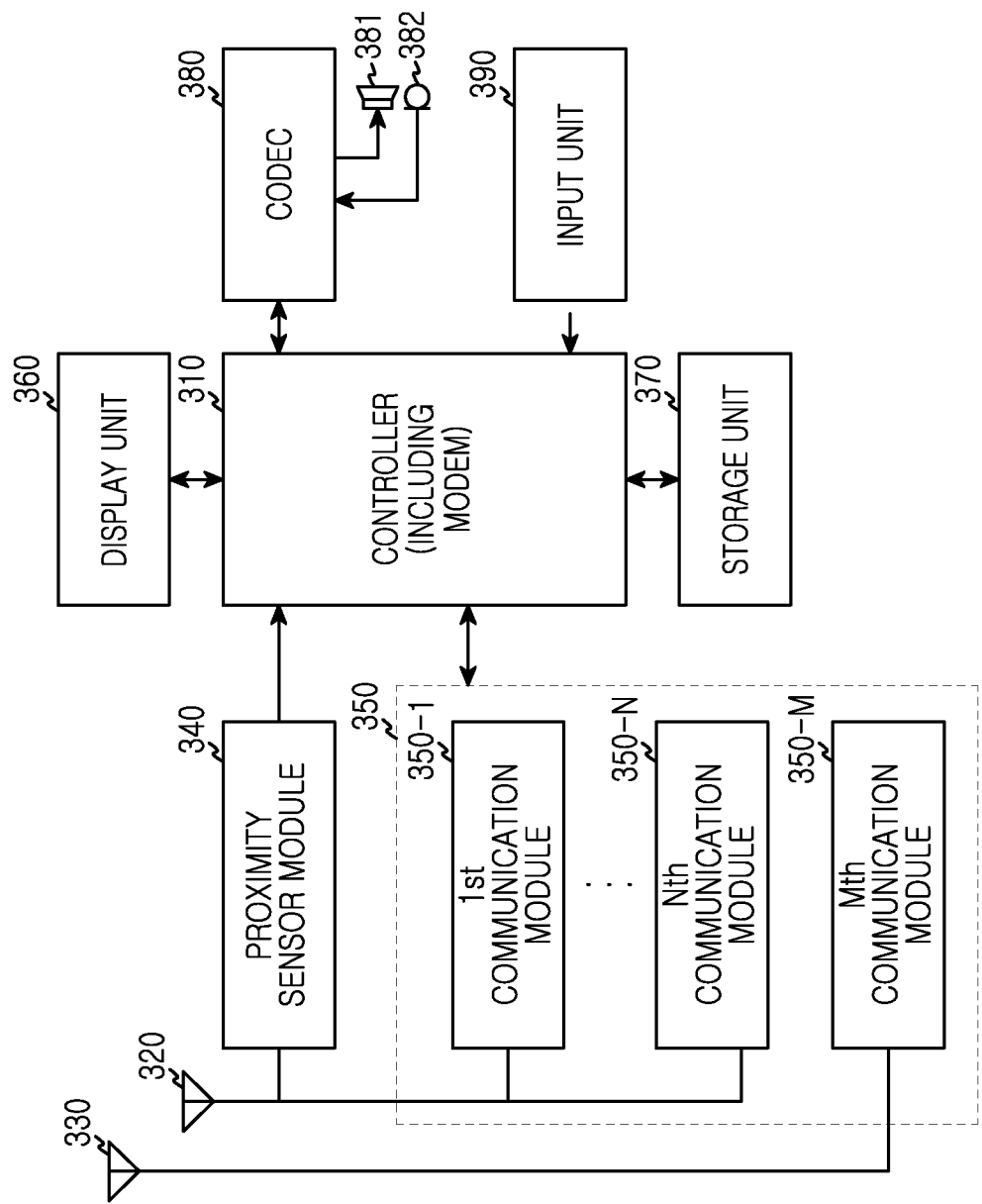
FIG. 3 is a block diagram of a portable wireless terminal according to an exemplary embodiment of the present invention.

FIG. 3 is a block diagram of a portable wireless terminal according to an exemplary embodiment of the present invention.

Referring to FIG. 3, the portable wireless terminal includes a controller 310, an antenna 320, a proximity sensor module 340, a communication module 350, a display unit 360, a storage unit 370, a codec 380, a speaker 381, a microphone 382, and an input unit 390.

The controller 310 provides overall control of the terminal. In particular, the controller 310 includes a modem for processing transmission and reception signals of the communication modules 350-1 . . . 350-N and 350-M, which will described in further detail, herein. However, the present invention is not limited thereto, and thus the communication modules 350-1 . . . 350-N and 350-M can be implemented such that the transmission and reception signals are individually processed.

The communication module 350 processes signals transmitted and received through a $1^{st}$ antenna 320 and a $2^{nd}$ antenna 330. The communication module 350 includes at least one or more communication modules 350-1 . . . 350-N, each of which serves its own communication service band. The communication module 350 can include communication modules for at least one or more communication protocols such as, LTE, WiMAX, CDMA, GSM, PCS, DCS, WCDMA, EVDO, HSPA, GPS, BT, and WiFi. In addition, the controller 310 can determine an appropriate communication module according to a communication environment (e.g., a handover to a heterogeneous network) and an environment configured by a user.

In particular, the $1^{st}$ antenna 320 can transmit and receive a signal in at least one or more communication service bands. Further, the $1^{st}$ antenna 320 also serves as a sensor element of the proximity sensor module 340. As illustrated, the terminal can additionally include $2^{nd}$ antenna 330 for transmitting and receiving a signal in a corresponding communication service band. The $2^{nd}$ antenna 330 is different from the $1^{st}$ antenna 320, which serves as the sensor element. According to the exemplary embodiment of the present invention, one antenna provides for an integration of two functions to allow for two usages. As a result, a reduction in a mount space to include this dual-use antenna is obtained. Consequently there is also a saving in manufacturing cost as a single integrated element is used for two functions.

The proximity sensor module 340 outputs a proximity signal corresponding to an electrostatic capacitance, which varies depending on a distance between the $1^{st}$ antenna 330 and a conductor (e.g., an object such as a hand), to the controller 310. Further, the proximity sensor module 340 may output the proximity signal to the controller 310 in response to a detected change in the sensor unit or when the electrostatic capacitance (i.e., a detected change in the sensor unit) reaches a threshold level. According to the exemplary embodiment of the present invention, when the proximity signal is received from the proximity sensor module 340, the controller 310 can reduce a specific absorption rate (SAR) by decreasing power supplied to the $1^{st}$ antenna 320 or the $2^{nd}$ antenna 330. For example, when a user places the terminal near their ear during a voice communication, the controller 310 can reduce the SAR by decreasing power supplied to the 1$^{st}$ antenna 320 or the 2$^{nd}$ antenna 330. However, the decreasing of the power supplied to the 1$^{st}$ antenna 320 or the 2$^{nd}$ antenna 330 decreases the radiation of the antenna but does not result in a deterioration of radiation performance.

The present invention can include various sensor modules equivalent to the proximity sensor module 340. For example, the terminal can include a touch sensor module, a thermal sensor module, a humidity sensor module, etc. However, it is important that the 1$^{st}$ antenna 320 also serves as a sensor element for such sensor modules. For example, the terminal can include a thermal sensor module, and the 1$^{st}$ antenna 320 can be used as a sensor element for the thermal sensor module. When radiation performance of the 1$^{st}$ antenna 320 decreases, an electromagnetic wave which is not smoothly radiated becomes a factor in a temperature rising in the terminal. That is, when antenna performance deteriorates, the terminal may become abnormally overheated and thus may operate erroneously. The thermal sensor module can sense varying temperature through the 1$^{st}$ antenna 320, and can report the sensed result to the controller 310. Upon sensing of the temperature which causes an unreliable operation of the terminal, the controller 310 can drive a corresponding cooler.

Since the display unit 360, the storage unit 370, the codec 380, the input unit 390, the microphone 381, and the speaker 382 are well-known elements of the terminal, a detailed description of these devices will not be provided so as not to obscure the invention claimed.

Hereinafter, a metal member used both as an antenna and a sensor element, and an apparatus interworking with the metal member will be described with reference to the accompanying drawings according to different aspects of exemplary embodiments of the present invention.

Figure 4:
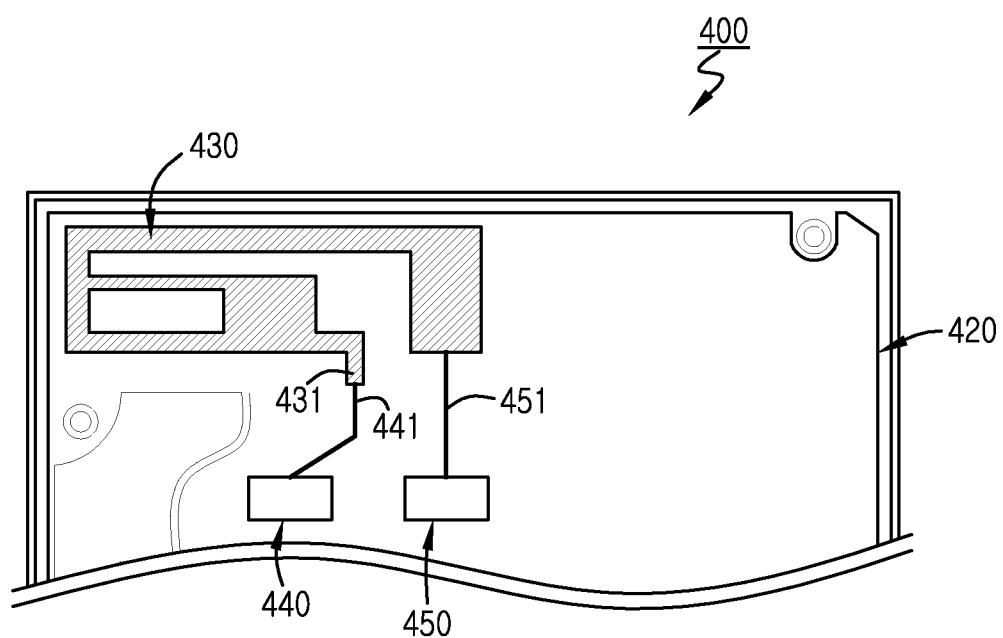
FIG. 4, FIG. 5, FIG. 6, FIG. 7A, FIG. 7B, FIG. 8A, FIG. 8B, FIG. 9A, FIG. 9B, FIG. 10A, FIG. 10B, FIG. 11A, FIG. 11B, FIG. 12A and FIG. 12B represent different aspects of an integrated antenna and sensor element according to an exemplary embodiment of the present invention.

FIG. 4 is illustrates a first aspect of a metal member used both as an antenna and a sensor element, and an apparatus including the metal member according to an exemplary embodiment of the present invention.

Referring to FIG. 4, the apparatus 400 includes a metal member 430 and a main board 420. The metal member 430 has electrostatic capacitance which varies depending on a distance of an approaching conductor and that transmits and receives a signal in at least one or more communication service bands. The main board 420 includes a communication module 440 and a proximity sensor module 450 to interwork (i.e., interact) with the metal member 430.

The communication module 440 processes a signal transmitted and received by the metal member 430. The proximity sensor module 450 senses varying electrostatic capacitance of the metal member 430. A controller (not shown) included in the main board 420 communicates with the communication module 440 and the proximity sensor module 450 to control a corresponding operation.

The main board 420 is a circuit board on which well-known circuitry and components are placed (not shown). The main board 420 is a part used to configure an execution environment of the terminal and maintain information, to drive the terminal reliably, and to facilitate data input/output exchanges of all devices of the terminal. The main board 420 includes components such as a Central Processing Unit (CPU), a microprocessor, a co-processor, a memory, a Basic Input/Output System (BIOS), a connecting circuit, etc. The circuitry connecting these components is also well-known and need not be discussed in detail herein.

The metal member 430 may be a thin metal film deposited when the main board 420 is manufactured or may be a metal plate attached to a non-ground portion of the main board 420 through post-processing. The metal member 430 can oscillate in a corresponding communication service band, and has a shape that causes variation of its electrostatic capacitance when a conductor approaches. The metal member 430 includes a power feeding node 431 to which current is supplied from the communication module 440, and thus operates as a monopole-type antenna. The power feeding node 431 of the metal member 430 is electrically connected to the communication module 440 via a line 441. The proximity sensor module 450 is electrically connected to the metal member 430 via a line 451. Further, the metal member 430 is preferably located near a perimeter of the terminal to ensure antenna performance and proximity sensor performance.

Figure 5:
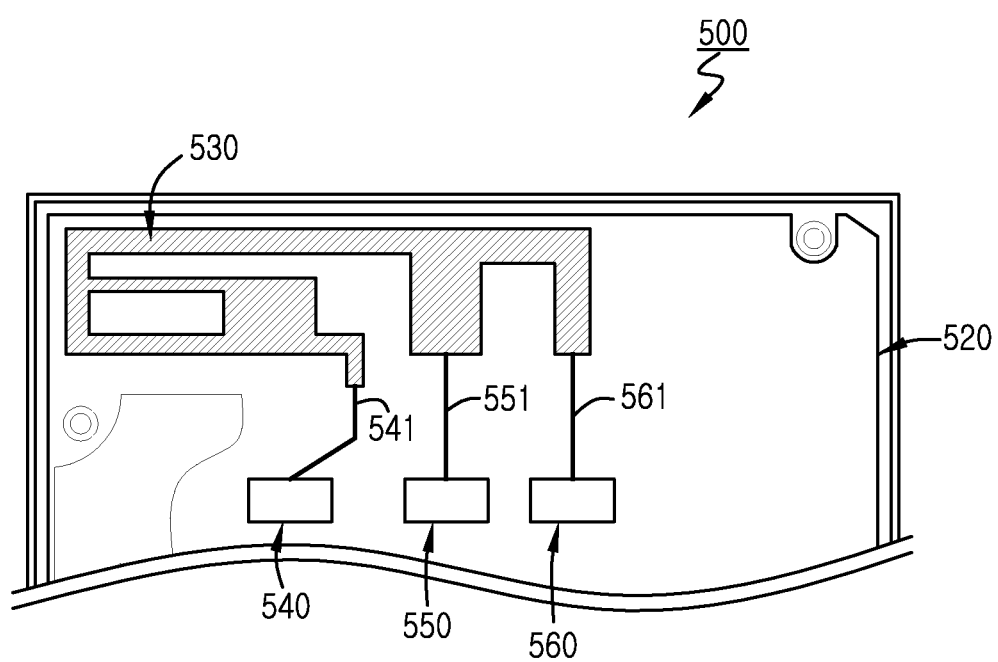

FIG. 5 illustrates another aspect of a metal member used both as an antenna and a sensor element, and an apparatus including the metal member according to an exemplary embodiment of the present invention.

Referring to FIG. 5, the apparatus 500 includes a metal member 530 and a main board 520. The metal member 530 has electrostatic capacitance that varies depending on a distance to an approaching conductor and that transmits and receives a signal in at least one or more communication service bands. The main board 520 includes a 1$^{st}$ communication module 540, a 2$^{nd}$ communication module 560, and a proximity sensor module 550 to interwork with the metal member 530.

The metal member 530 can oscillate in a corresponding communication service band, and has a shape that can vary its electrostatic capacitance when a conductor approaches. The metal member 530 is electrically connected to the 1$^{st}$ communication module 540, the 2$^{nd}$ communication module 560, and the proximity sensor module 550, respectively, via lines 541, 551, and 561 through which current is supplied. The metal member 530 operates as a monopole-type antenna, and, thus, transmits and receives a signal of a communication service band handled by the proximity sensor module 550 and a signal of a communication service band handled by one or both of the 1$^{st}$ communication module 540 and/or the 2$^{nd}$ communication module 560.

Although the apparatus 500 according to the exemplary embodiment of the present invention includes two communication modules 540 and 560, two or more communication modules can use the metal member 530 as a radiator (antenna). Further, in addition to the proximity sensor module 550, the apparatus 500 according to the exemplary embodiment of the present invention can include one or more sensor modules, which use the metal member 530 as a sensor element.

Figure 6:
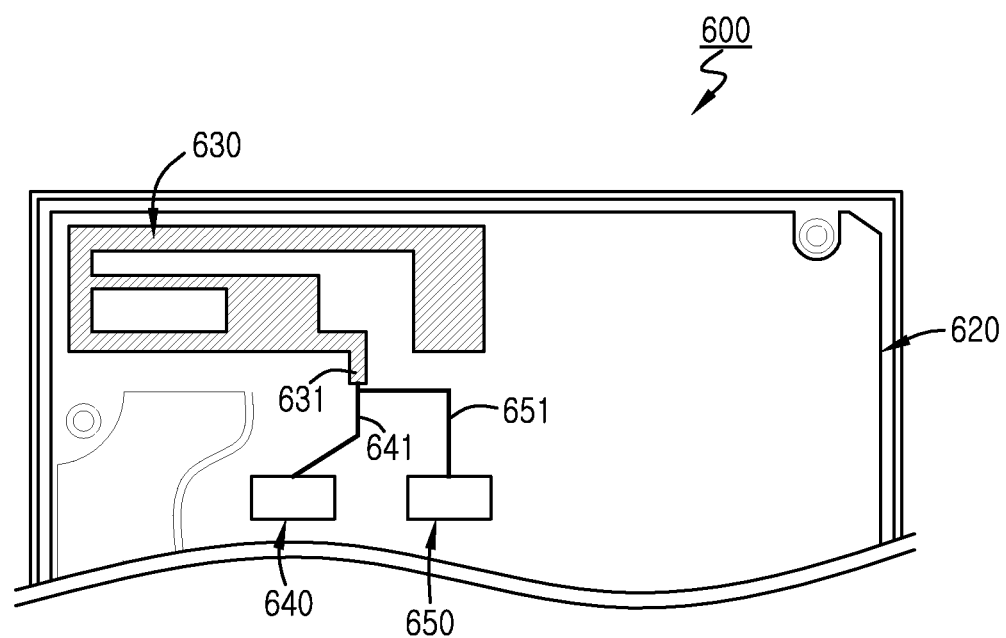

FIG. 6 illustrates another aspect of a metal member used both as an antenna and a sensor element, and an apparatus including the metal member according to an exemplary embodiment of the present invention.

Referring to FIG. 6, the apparatus 600 includes a metal member 630 and a main board 620. The metal member 630 has electrostatic capacitance that varies depending on a distance to an approaching conductor and that transmits and receives a signal in at least one or more communication service bands. The main board 620 includes a communication module 640 and a proximity sensor module 650 to interwork (i.e., interact) with the metal member 630.

The metal member 630 can oscillate in a corresponding communication service band, and has a shape that can vary its electrostatic capacitance when a conductor approaches. The metal member 630 includes a power feeding node 631 to which current is supplied, and, thus, operates as a monopole-type antenna. Unlike the embodiment of FIG. 4, lines 641 and 651 branch from a single power feeding node 631 of the metal member 630 and, thus, electrically connect to the communication module 640 and the proximity sensor module 650.

Figure 7A:
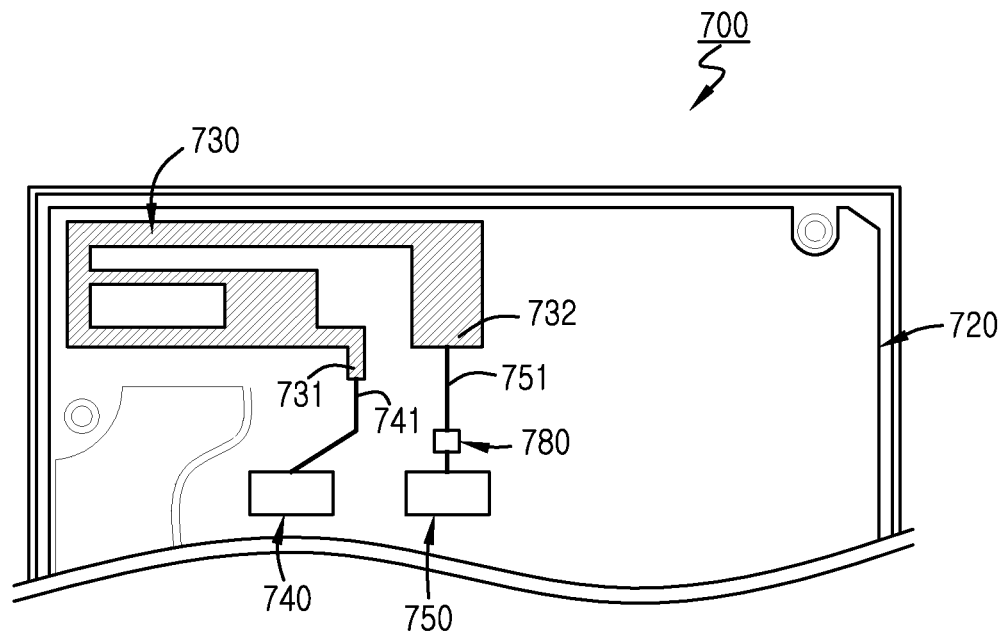
Figure 7B:
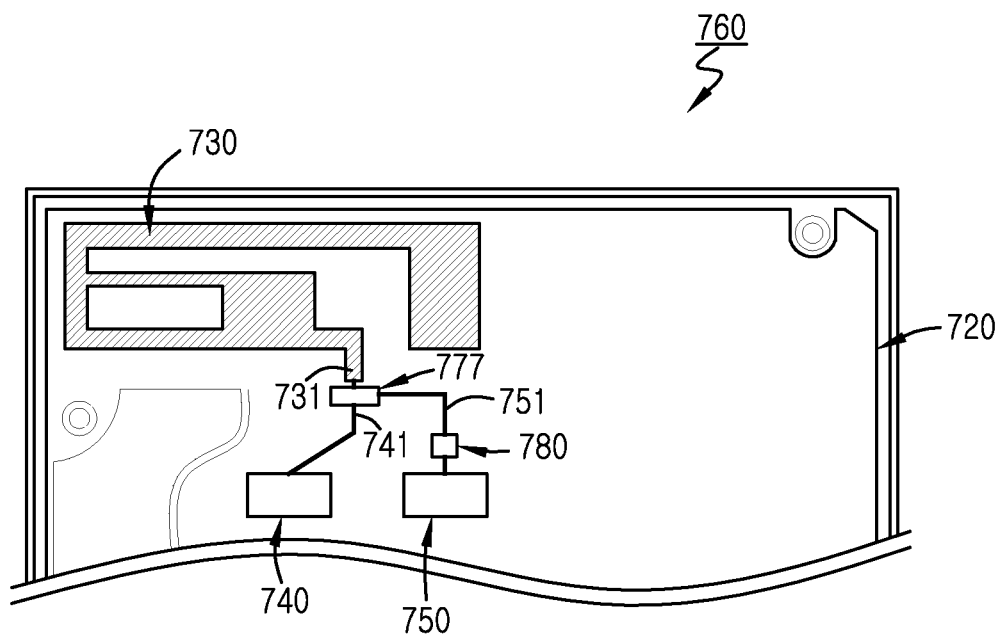

FIGS. 7A and 7B illustrate additional aspects of a metal member used both as an antenna and a sensor element, and an apparatus including the metal member according to an exemplary embodiment of the present invention.

Referring to FIGS. 7A and 7B, the apparatus generally includes a metal member 730 and a main board 720. The metal member 730 has an electrostatic capacitance that varies depending on a distance of an approaching conductor and that transmits and receives a signal in at least one or more communication service bands. The main board 720 includes a communication module 740 and a proximity sensor module 750 to interwork with the metal member 730.

Referring to FIG. 7A, the apparatus 700 includes a communication module 740 and the proximity sensor module 750 are electrically connected to different nodes 731 and 732 of the metal member 730 via lines 741 and 751. Therefore, a signal processed by the communication module 740 and a signal processed by the proximity sensor module 750 may be processed in parallel. The node 732 at which the proximity sensor module 750 is electrically connected to the metal member 730 is preferably selected as a position remote, more preferably, as remote as, from the node 731.

Referring to FIG. 7B, the apparatus 760 includes a power feeding node 731 of the metal member 730 is electrically connected to the communication module 740 and the proximity sensor module 750 via the branched lines 741 and 751. The apparatus 700 may include a filter 777 for branching the signal processed by the communication module 740 and the signal processed by the proximity sensor module 750. For example, the communication module 740 may process a signal within the band of 600 MHz to approximately 3 GHz while the proximity sensor module 750 may process a signal in the band of 1 MHz to approximately 13 MHz.

That is, the metal member may provide an oscillation signal in the 0.6-3 GHz range in response to a communication signal, while the metal member may also provide an oscillation signal (information) in the 1-13 Mhz band in response to a sensed object. These oscillations (or information) may then be filtered and directed to the appropriate communication module or sensor module dependent upon the frequency band. The receiving communication module and/or sensor module may then generate corresponding signals to a controller member.

In particular, the apparatus 700 (FIG. 7A) and 760 (FIG. 7B) includes at least one or more antenna elements to prevent antenna performance against deterioration caused by the proximity sensor module 750. For example, the antenna element may be a floating inductor 780 provided to a node of the proximity sensor module 750. As illustrated, the floating inductor 780 is provided to the line 751 connecting the metal member 730 and the proximity sensor module 750.

Figure 8A:
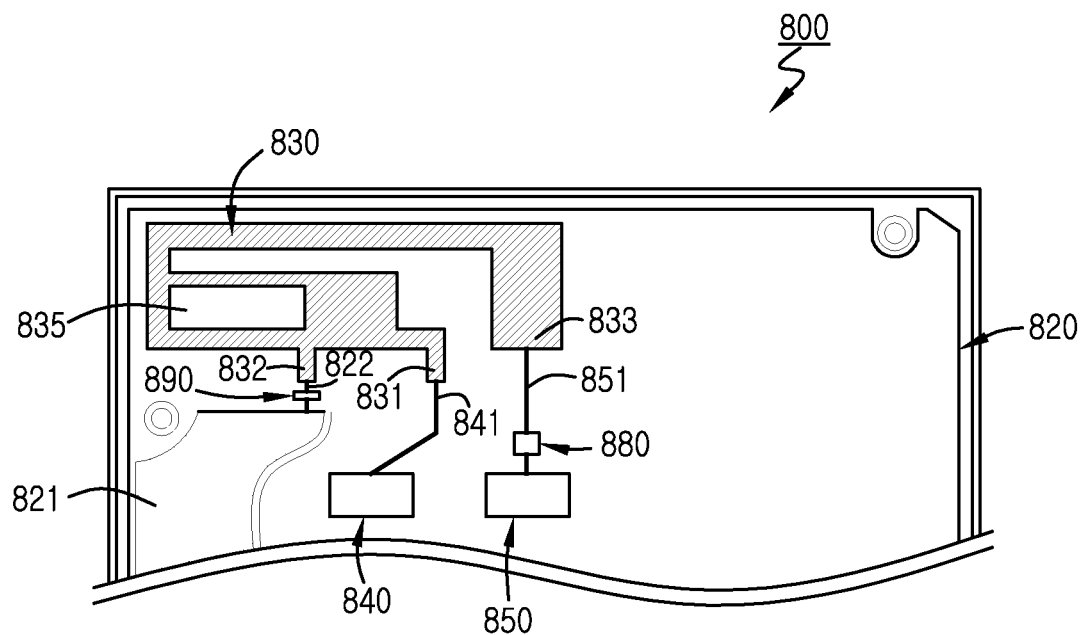
Figure 8B:
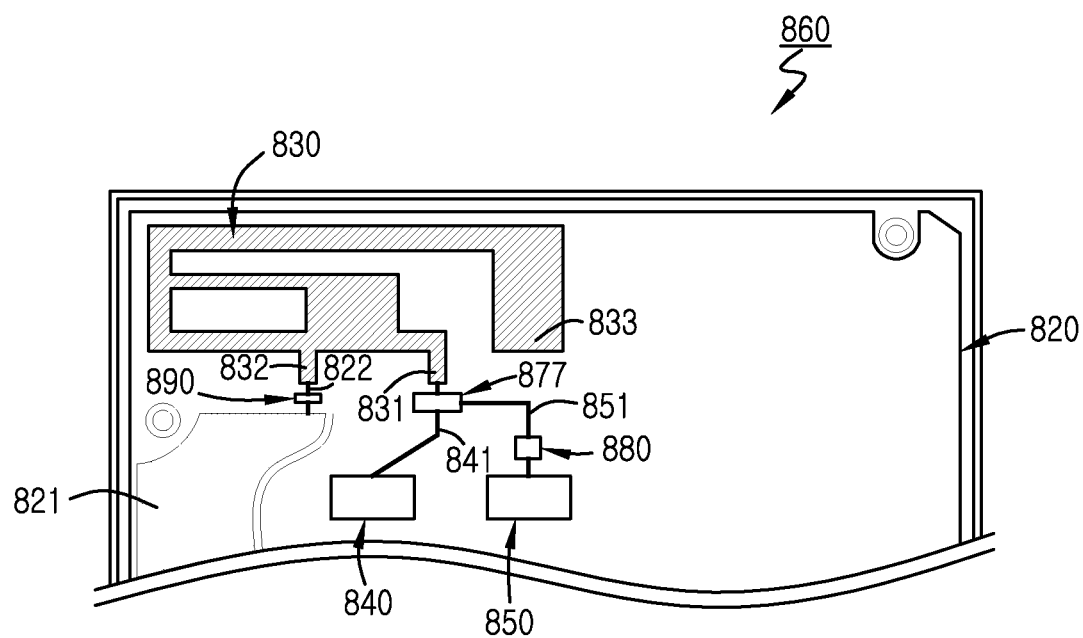

FIGS. 8A and 8B illustrate additional aspects of a metal member used both as an antenna and a sensor element, and an apparatus including the metal member according to an exemplary embodiment of the present invention.

Referring to FIGS. 8A and 8B, the apparatus includes a metal member 830 and a main board 820. The metal member 830 has an electrostatic capacitance that varies depending on a distance of an approaching conductor and that transmits and receives a signal in at least one or more communication service bands. The main board 820 includes a communication module 840 and a proximity sensor module 850 to interwork with the metal member 830.

Referring to FIG. 8A, the apparatus 800 includes a metal member 830 that can operate as a Planar Inverted F Antenna (PIFA) or an Inverted F Antenna (IFA) having a power feeding node 831 for supplying current and a ground node 832 for providing grounding node. The power feeding node 831 of the apparatus 800 is electrically connected to the communication module 840 via a line 841. The ground node 832 of the metal member 830 is electrically connected to a ground plane or surface 821 of the main board 820 via a line 822.

The communication module 840 and the proximity sensor module 850 are electrically connected to the different nodes 831 and 833 of the metal member 830 via the lines 841 and 851. Therefore, a signal processed by the communication module 840 and a signal processed by the proximity sensor module 850 may be processed in parallel.

Further, when the metal member 830 is grounded to the ground 821 of the main board 820, the proximity sensor module 850 does not operate normally. To avoid this abnormal operation, at least one or more elements (e.g., a series capacitor 890) are provided to the ground node 832. As illustrated, the series capacitor 890 is provided to a line 822 connecting the ground node 832 and the ground 821. Due to the series capacitor 890 provided to the ground node 832, the proximity sensor module 850 can recognize that the ground node 832 is open and thus can normally operate.

Referring to FIG. 8B, the apparatus 860 includes a power feeding node 831 of the metal member 830 that electrically connected to the communication module 840 and the proximity sensor module 850 via the branched lines 841 and 851. The apparatus 800 can include a filter 877 for branching the signal processed by the communication module 840 and the signal processed by the proximity sensor module 850.

As described with regard to FIG. 8A, when the metal member 830 is grounded to the ground 821 of the main board 820, the proximity sensor module 850 does not operate normally. To avoid this, at least one or more antenna elements (e.g., a series capacitor 890) are provided to the ground node 832. As illustrated, the series capacitor 890 is provided to a line connecting the ground node 832 and the ground 821. Due to the series capacitor 890 provided to the ground node 832, the proximity sensor module 850 can recognize that the ground node 832 is open and thus can normally operate.

The remaining components shown in FIG. 8B are comparable to those described with regard to FIG. 8A and, thus, a discussion of the operation of these components need not be repeated in detail herein.

In addition, the apparatus 800 (FIG. 8A) and 860 (FIG. 8B) includes at least one or more antenna elements to protect antenna performance against deterioration caused by the proximity sensor module 850. For example, the antenna element may be a floating inductor 880 provided to a node of the proximity sensor module 850. As illustrated, the floating inductor 880 is provided to the line 851 connecting the metal member 830 and the proximity sensor module 850.

Figure 9A:
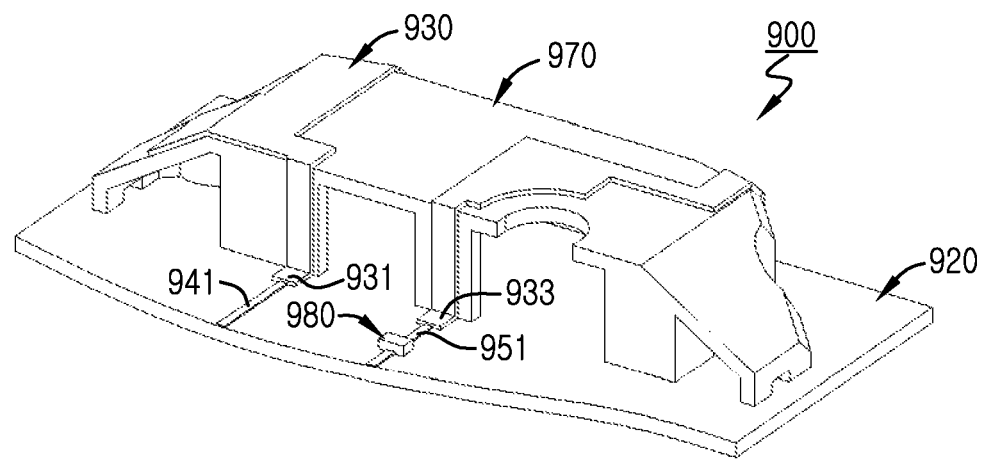
Figure 9B:
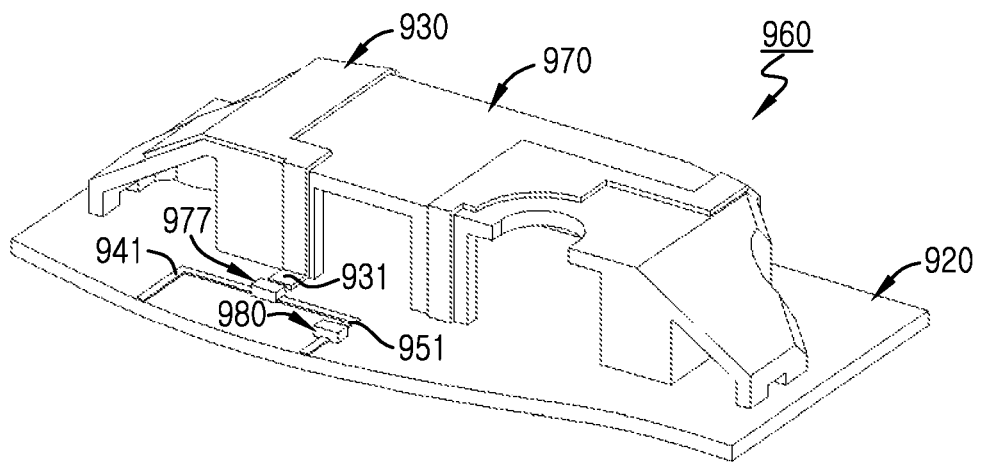

FIGS. 9A and 9B illustrate perspective drawings of the apparatus shown in corresponding FIGS. 7A and 7B wherein the apparatus includes a metal member used both as an antenna and a sensor element, and an apparatus including the metal member according to an exemplary embodiment of the present invention.

Referring to FIGS. 9A and 9B, the apparatus includes a metal member 930 and a main board 920. The metal member 930 has an electrostatic capacitance that varies depending on a distance of an approaching conductor and that transmits and receives a signal in at least one or more communication service bands. The main board 920 includes a communication module and a proximity sensor module to interwork with the metal member 930. In particular, the metal member 930 is attached to an injection molding member (hereinafter, a carrier) 970 fastened to the main board 920. The metal member 930 has a curved shaped along an outer circumference (perimeter) of the carrier 970.

Referring to FIG. 9A, the apparatus 900 includes a communication module (not shown) and proximity sensor module (not shown), which are electrically connected to the different nodes 931 and 933 of the metal member 930 via the lines 941 and 951, respectively.

Therefore, a signal processed by the communication module and a signal processed by the proximity sensor module 950 may be branched (processed in parallel). The metal member 930 operates as a monopole antenna by receiving power supplied from the communication module. Further, a power feeding sensor module senses variations in the electrostatic capacitance of the metal member 930 and outputs a signal corresponding to the sensing result to a controller. The apparatus shown in FIG. 9A operates in a manner similar to that described with regard to FIG. 7A.

Referring to FIG. 9B, the apparatus 960 includes a node 931 of the metal member 930 that electrically connects to the communication module (not shown) and the proximity sensor module (not shown) via the branched lines 941 and 951, respectively. In this case, the apparatus 960 can include a filter 977 for branching the signal processed by the communication module and the signal processed by the proximity sensor module 950. The apparatus shown in FIG. 9B operates in a manner similar to that described with regard to FIG. 7B.

In particular, the apparatus 900 (FIG. 9A) and 960 (FIG. 9B) includes at least one or more antenna elements to protect antenna performance against deterioration caused by the proximity sensor module. For example, the antenna element may be a floating inductor 980 provided to a node of the proximity sensor module. As illustrated, the floating inductor 980 is provided to the line 951 connecting the metal member 930 and the proximity sensor module.

Figure 10A:
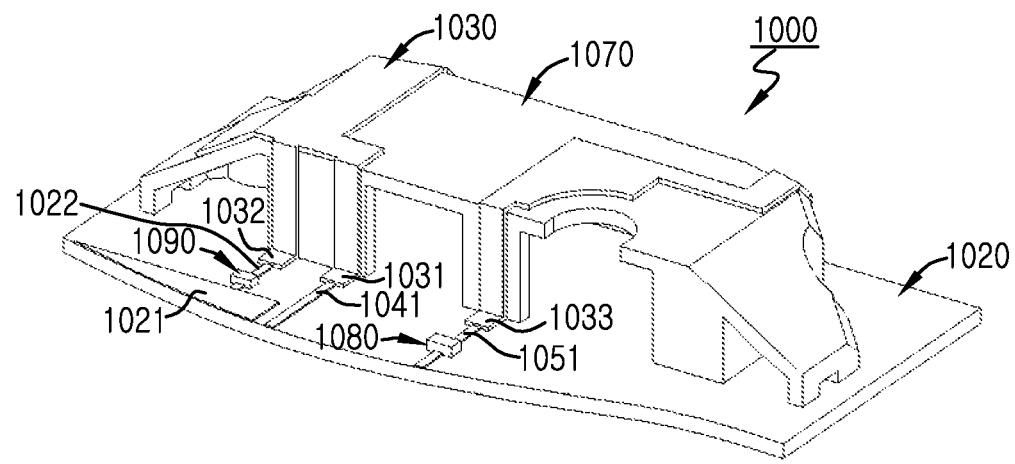
Figure 10B:
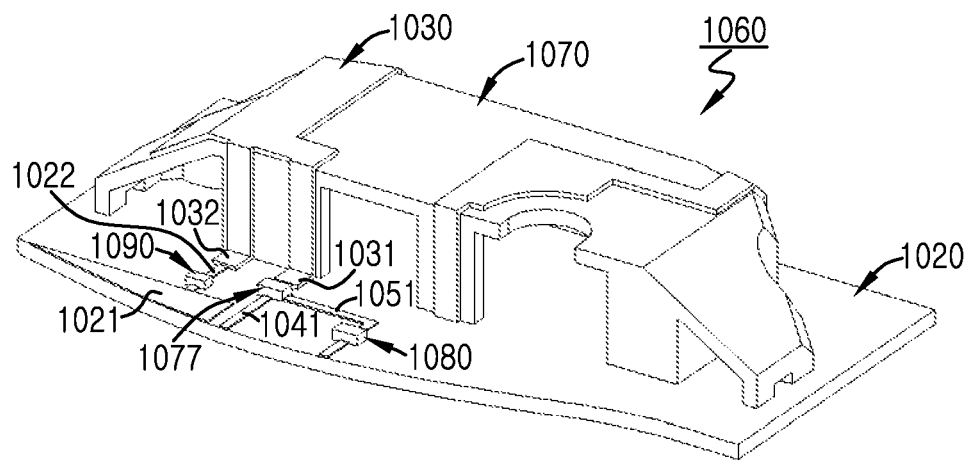

FIGS. 10A and 10B illustrate perspective drawings of the apparatus shown in corresponding FIGS. 7A and 7B, respectively.

Referring to FIGS. 10A and 10B, the apparatus includes a metal member 1030 and a main board 1020. The metal member 1030 has electrostatic capacitance that varies depending on a distance to an approaching conductor and that transmits and receives a signal in at least one or more communication service bands. The main board 1020 includes a communication module (not shown) and a proximity sensor module (not shown) to interwork with the metal member 1030. In particular, the metal member 1030 is attached to an injection molded member (hereinafter, a carrier) 1070 fastened to the main board 1020. The metal member 1030 has a curved shaped along an outer circumference of the carrier 1070. As would be recognized, the molded member may be made of an insulating material (e.g., a plastic or rubber) to prevent interference with the antenna performance characteristics.

The metal member 1030 can operate as a FIFA or an IFA having a power feeding node 1031 for supplying current and a ground node 1032 for grounding. The power feeding node 1031 of the apparatus 1000 is electrically connected to the communication module via a line 1041. The ground node 1032 of the metal member 1030 is electrically connected to a ground 1021 of the main board 1020 via a line 1022.

Referring to FIG. 10A, the apparatus 1000 includes a communication module and a proximity sensor module (neither of which are shown) that are electrically connected to different nodes 1031 and 1033 of the metal member 1030 via the lines 1041 and 1051.

Therefore, a signal processed by the communication module 1040 and a signal processed by the proximity sensor module 1050 may be processed in parallel.

FIG. 10A operates in a manner similar to that described with regard to FIG. 8A and need not repeated again herein.

Referring to FIG. 10B, the apparatus 1060 includes a power feeding node 1031 of the metal member 1030 that electrically connected to the communication module (not shown) and the proximity sensor module (not shown) via the branched lines 1041 and 1051. The apparatus 1060 can include a filter 1077 for branching the signal processed by the communication module 1040 and the signal processed by the proximity sensor module 1050.

FIG. 10B operates in a manner similar to that described with regard to FIG. 8B and need not repeated again herein.

In general, with regard apparatus 1000 (FIG. 10A) and the apparatus 1060 (FIG. 10B) at least one or more antenna elements are included to prevent antenna performance degradation caused by the (not shown) proximity sensor module. For example, the antenna element may be a floating inductor 1080 connected to a node of the proximity sensor module. As illustrated, the floating inductor 1080 is provided to the line 1051 connecting the metal member 1030 and the proximity sensor module.

Further, when the metal member 1030 is grounded to the ground 1021 (FIG. 10B) of the main board 1020, the proximity sensor module does not operate normally. To avoid this, at least one or more antenna elements (e.g., a series capacitor 1090) are connected to the ground node 1032. As illustrated, the series capacitor 1090 is provided to a line connecting the ground node 1032 and the ground 1021. Due to the series capacitance 1090 provided to the ground node 1032, the proximity sensor module can recognize that the ground node 1032 is open and thus can normally operate.

Figure 11A:
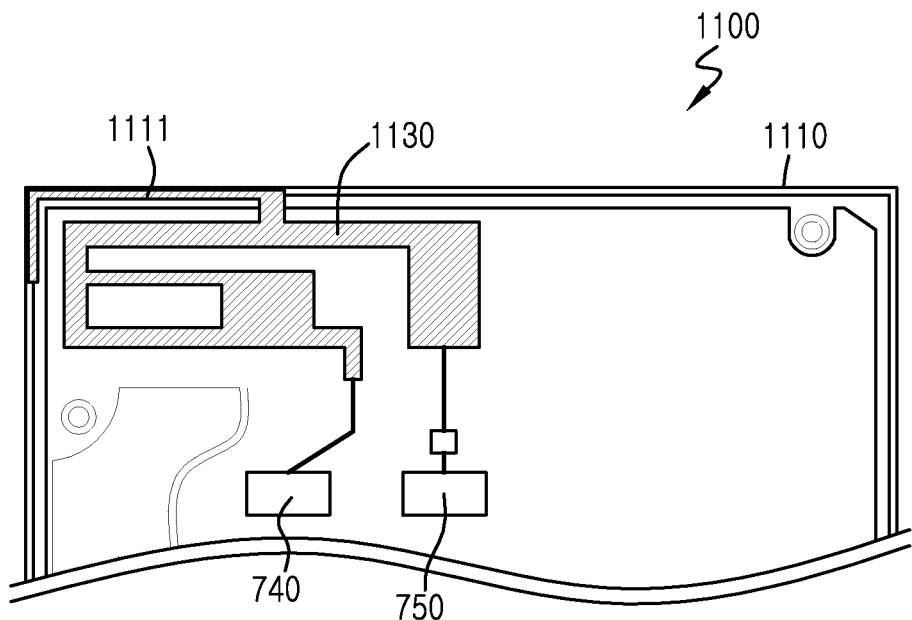
Figure 11B:
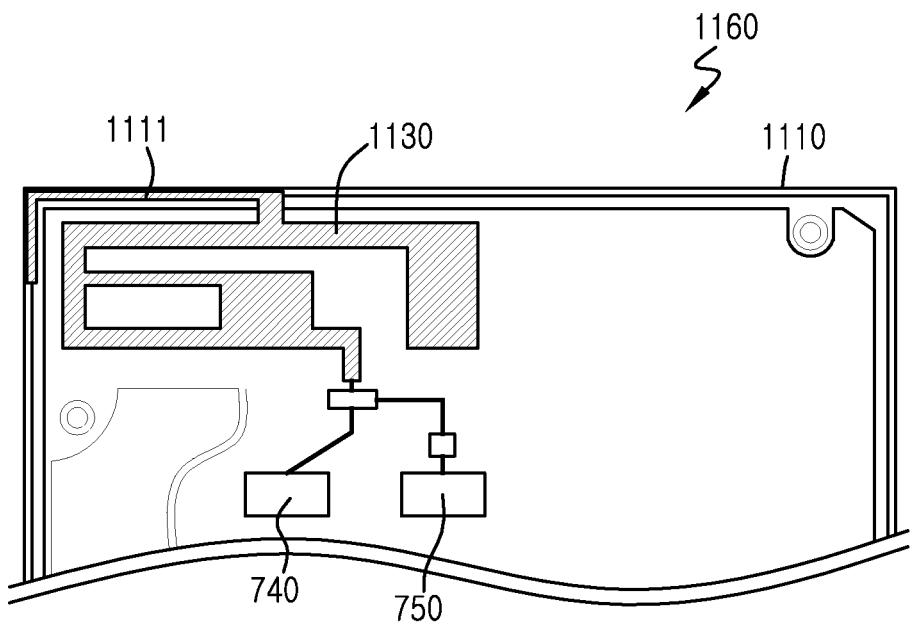
Figure 12A:
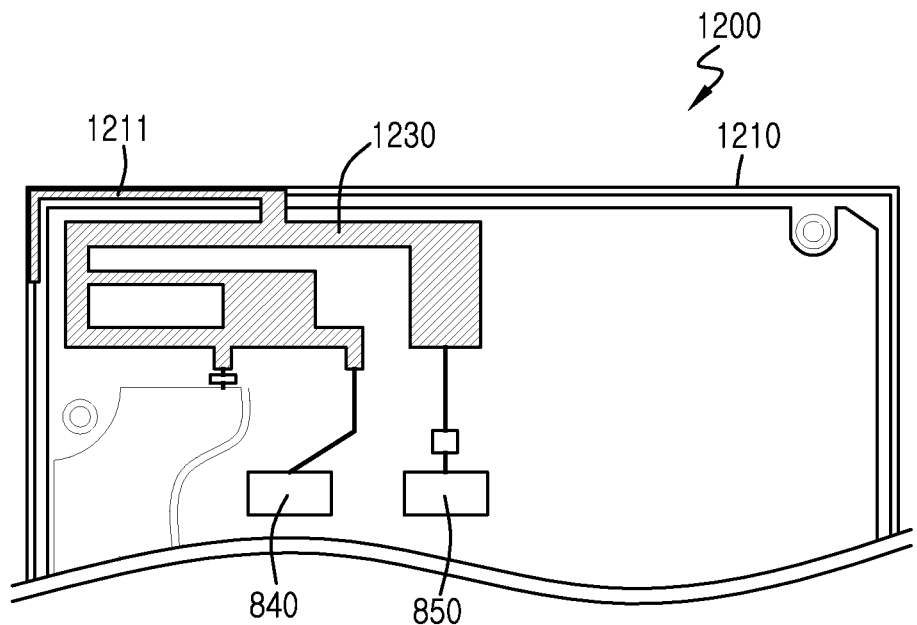
Figure 12B:
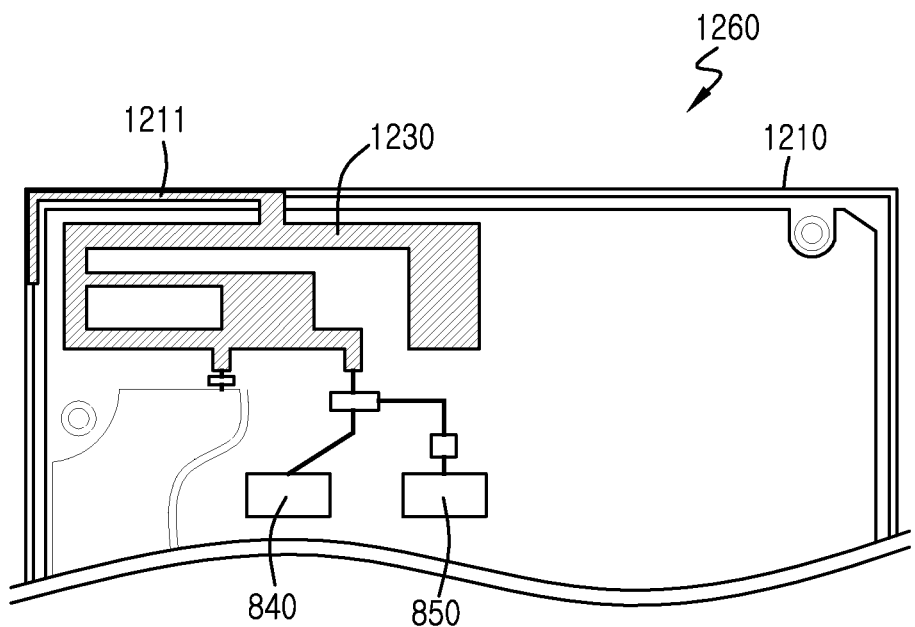

FIGS. 11A, 11B, 12A and 12B illustrate further aspects of a metal member used both as an antenna and a sensor element, and an apparatus including the metal member according to an exemplary embodiment of the present invention. FIG. 11A has a structure similar to the embodiment 700 of FIG. 7A, FIG. 11B has a structure similar to the embodiment 760 of FIG. 7B, FIG. 12A has a structure similar to the embodiment 800 of FIG. 8A and FIG. 12B has a structure similar to the embodiment 860 of FIG. 8B. However, FIGS. 11A-12B are different then corresponding FIGS. 7A-8B in that the metal member 1130 of an embodiment 1100 of FIG. 11A and 1160 of FIG. 11B and the metal member 1230 of an embodiment 1200 of FIG. 12A and 1260 of FIG. 12B are different from the metal members of the apparatuses 700, 760, 800 and 860 of FIGS. 7A-FIG. 8B, respectively.

More specifically, the metal members 1130 and 1230 of FIG. 11A and 11B and FIG. 12A and 12B, respectively, can be extended up to case frames 1110 and 1210, respectively, by extensions 1111 and 1211 to form an external appearance of the portable terminal, respectively. Further, the extension elements 1111 and 1211 of metal members 1130 and 1230, respectively, can include metal elements that contribute to the case frames 1110 and 1210 that form the external appearance of the portable terminal. For example, metal brims exposed externally to beatify the external appearance of the terminal and formed on the case frames 1110 and 1210 can operate as an antenna or a sensor element, in accordance with the principles of the invention.

Figure 13:
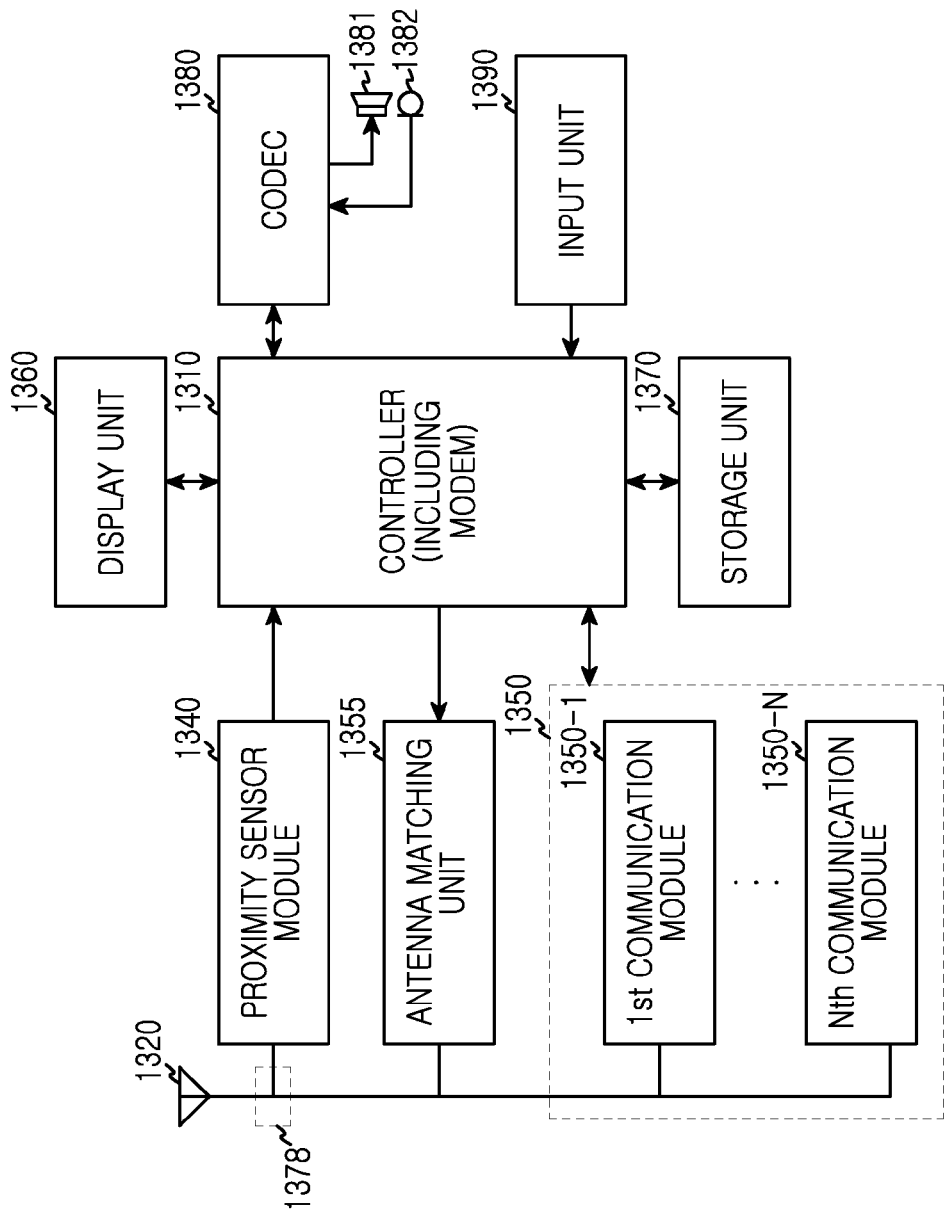
FIG. 13 and FIG. 14 are block diagrams of a portable wireless terminal according to an exemplary embodiment of the present invention.

FIG. 13 is a block diagram of a portable wireless terminal according to an exemplary embodiment of the present invention.

Referring to FIG. 13, the portable wireless terminal includes a controller 1310, an antenna 1320, a proximity sensor module 1340, a communication module 1350, an antenna matching unit 1355, a display unit 1360, a storage unit 1370, a codec 1380, a speaker 1381, a microphone 1382, and an input unit 1390.

The controller 1310 provides overall control to the portable terminal. In particular, the controller 1310 includes a modem for processing transmission and reception signals of communication module 1350. However, the present invention is not limited thereto, and thus the communication module 1350 can be implemented such that the transmission and reception signals are individually processed.

The communication module 1350 processes signals having a corresponding communication service band that are transmitted and/or received through the antenna 1320 and the antenna matching unit 1355. The communication module 1350 includes at least one or more communication modules 1350-1 . . . 1350-N, each of which is associated with a communication service band. The controller 1310 can determine an appropriate communication module according to a communication environment (e.g., a handover to a heterogeneous network) and an environment configured by a user.

The antenna 1320 can transmit and receive a signal in at least one or more communication service bands. Further, the antenna 1320 also serves as a sensor element of the proximity sensor module 1340. According to the exemplary embodiment of the present invention, one antenna is used for two usages. As a result, a mounting space within a form factor of currently available portable terminals can be achieved as the dual-use of the antenna 1320 provides for a reduced space requirement. In addition, by allowing one component (or element) to perform multiple functions, there is a savings in manufacturing cost.

The portable terminal can further include a branching unit 1378 having a filter for branching the signal processed by the communication module 1350 and the signal processed by the proximity sensor module 1340 among signals transmitted through the antenna 1320, as described with regard to FIG. 7B, for example.

The proximity sensor module 1340 outputs a signal associated with an electrostatic capacitance to the controller 1310. The capacitance varies depending on a distance between the antenna 1320 and a conductor (e.g., a hand). Further, the proximity sensor module 1340 may output a proximity signal to the controller 1310 as the electrostatic capacitance varies or only when the electrostatic capacitance reaches a threshold value. According to the exemplary embodiment of the present invention when the proximity signal is received from the proximity sensor module 1340, the controller 1310 can reduce a specific absorption rate (SAR) by decreasing power supplied to the antenna 1320.

Further, the controller 1310 controls the antenna matching unit 1355 for ensuring antenna performance in association with the antenna 1320 according to a magnitude of electrostatic capacitance received from the proximity sensor module 1340 or according to whether a power feeding signal is received from the proximity sensor module 1340. For example, if no proximity signal is received from the proximity sensor module 1340, the controller 1310 controls the antenna matching unit 1355 according to a first method, and if a proximity signal is received from the proximity sensor module 1340, the controller 1310 controls the antenna matching unit 1355 according to a second method. When the proximity signal is generated from the proximity sensor module 1340, it indicates that a conductor is within a predetermined range of the antenna 1320.

Figure 14:
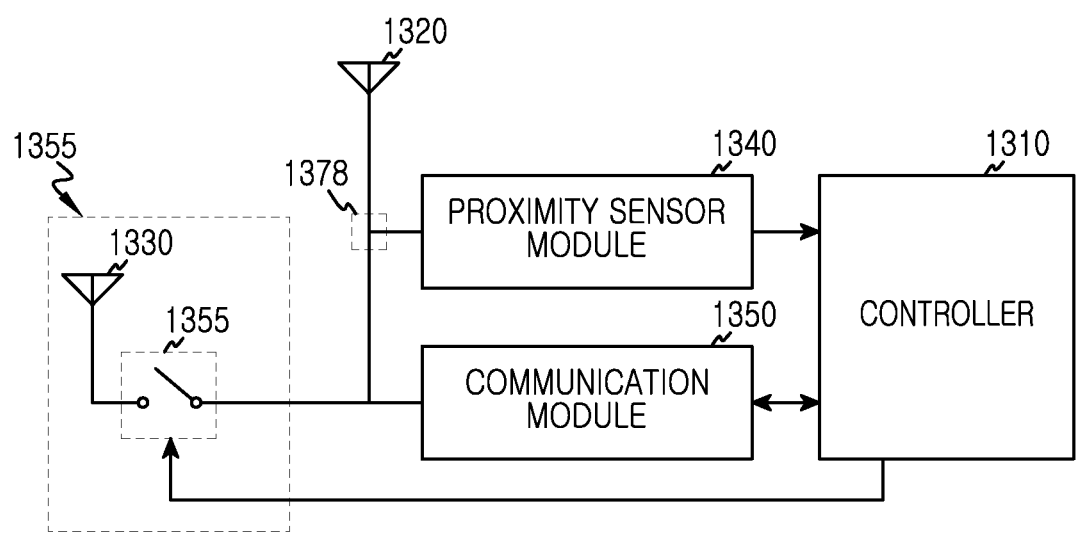

The antenna matching unit 1355 may be a circuit consisting of an antenna element such as a capacitor, an inductor, etc. According to pre-set control of the controller 1310, capacitance or inductance of the antenna matching unit 1355 is regulated. Alternatively, as illustrated in FIG. 14, the antenna matching unit 1355 can form an auxiliary antenna 1330 which oscillates (or not oscillate) with the antenna 1320 under the control of the controller 1310. Referring to FIG. 14, the antenna matching unit 1355 includes a switching unit 1355 for electrically connecting, or disconnecting, the auxiliary antenna 1330 under the control of the controller 1310.

Further, the present invention can include various sensor modules in place of the proximity sensor module 1340. For example, the terminal can include a touch sensor module, a thermal sensor module, a humidity sensor module, etc. However, it is important that the $1^{st}$ antenna 1320 also serve as the sensor element for such sensor modules. In addition, the controller 1310 can control the antenna matching unit 1355 by using information obtained from the sensor modules. For example, the terminal sensor module senses varying temperature through the antenna 1320, and can report the sensed result to the controller 1310. Upon sensing of the temperature which can cause deterioration in performance of the antenna 1320, the controller 1310 can control the antenna matching unit 1355 to ensure antenna performance.

The above-described methods with regard to the operation of the controller according can be implemented in hardware, firmware or via the execution of software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be rendered in such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

Thus, while the invention has been described with regard to varying electrostatic capacitance (proximity sensor), it would be recognized that the operation of the sensor module is based on an appropriate measured parameter (e.g., temperature) associated with a type of sensor module being considered.

Since the display unit 1360, the storage unit 1370, the codec 1380, the input unit 1390, the microphone 1381, and the speaker 1382 are well-known elements of the terminal, descriptions of these elements need not be provided herein for one skilled in the art to recognize and appreciate the inventive concept regarding replacing multiple elements with a single multi-functional element described herein.

In conclusion, the present invention provides a metal member used both as an antenna and a sensor element, and an apparatus interworking with the metal member to provide for a combined antenna/sensor element in a portable wireless terminal. Accordingly, the present invention can also provide for a decrease in manufacturing cost, make the terminal slimmer in size, and ensure both antenna performance and sensor performance.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. An apparatus comprising:
   an antenna adapted to obtain a first signal in a first frequency band, and a second signal in a second frequency band, the antenna including a feeding portion and a ground portion;
   communication circuitry electrically connected to the feeding portion and adapted to communicate with a first object external to the apparatus using the first signal obtained from the antenna;
   sensor circuitry electrically connected to the antenna and adapted to detect a second object external to the apparatus using the second signal received from the antenna;
   an inductor electrically connected between the sensor circuitry and the antenna, and adapted to electrically open the sensor circuitry with the antenna with respect to the first signal, or electrically connect the sensor circuitry with the antenna with respect to the second signal; and
   a capacitor electrically connected between the ground portion and a ground of the apparatus, and adapted to electrically open the ground portion from the ground with respect to the second signal, and electrically connect the ground portion with ground with respect to the first signal.

2. The apparatus of the claim 1, wherein the communication circuitry comprises cellular communication circuitry, worldwide interoperability for microwave (WiMAX) circuitry, wireless-fidelity (Wi-Fi) circuitry, bluetooth (BT) circuitry, global positioning system (GPS) circuitry, or any combination thereof.

3. The apparatus of the claim 1, wherein the sensor circuitry comprises a proximity sensor, a touch sensor, a thermal sensor, or any combination thereof.

4. The apparatus of the claim 1, wherein the inductor operates as a low-pass filter.

5. The apparatus of the claim 1, wherein the first object comprises an electronic device, and the second object comprises a human body.

6. The apparatus of the claim 1, further comprising a substrate including the ground and a feeding line, wherein the communication circuitry and the sensor circuitry are electrically connected to the feeding portion via the feeding line.

7. The apparatus of the claim 6, wherein the communication circuitry, the sensor circuitry, and at least one portion of filter circuitry are formed on the substrate.

8. The apparatus of the claim 6, wherein the feeding line comprises a first feeding line and a second feeding line, wherein the communication circuitry is electrically connected to the feeding portion via the first feeding line, and the sensor circuitry is electrically connected to the feeding portion via the second feeding line.

9. The apparatus of the claim 1, further comprising a housing forming at least one surface of the apparatus, wherein at least one portion of the antenna is formed as part of the at least one surface.

10. The apparatus of the claim 1, further comprising a carrier on which at least one portion of the antenna is mounted.

11. An apparatus comprising:
    a conductive member adapted to obtain a first signal in a first frequency band, and a second signal in a second frequency band, the conductive member including a feeding portion and a ground portion;
    first circuitry electrically connected to the feeding portion and adapted to communicate with an electronic device external to the apparatus using the first signal received from the conductive member;
    second circuitry electrically connected to the conductive member and adapted to detect state information related to the apparatus using the second signal received from the conductive member;
    an inductor connected between the second circuitry and the conductive member, and adapted to electrically open the second circuitry with the conductive member with respect to the first signal, or electrically connect the second circuitry with the conductive member with respect to the second signal; and
    a capacitor coupled between the ground portion and a ground of the apparatus, and adapted to electrically open the ground portion from the ground with respect to the second signal, and electrically connect the ground portion with ground with respect to the first signal.

12. The apparatus of the claim 11, further comprising one or more processors operatively electrically connected to the first circuitry and the second circuitry, wherein the one or more processors are configured to:
    identify a distance between the apparatus and a user corresponding to the apparatus based at least in part on the state information; and
    adjust a transmission power for the first circuitry to communicate with the electronic device based at least in part on a determination that the distance falls into a specified range of distance.

13. The apparatus of claim 12, wherein the one or more processors are configured to:
    determine the distance between the apparatus and the user according a level of capacitance detected using the second circuitry.

14. The apparatus of the claim 11, further comprising one or more processors configured to:
    identify a temperature of the apparatus based at least in part on the state information; and
    activate a function to decrease the temperature based at least in part on a determination that the temperature falls into a specified range of temperature.

15. The apparatus of the claim 11, wherein the second frequency band is lower than the first frequency band.

16. An apparatus comprising:
    a conductive member including a ground portion, a feeding portion, and a radiating portion, the conductive member adapted to obtain a first signal in a first frequency band, and a second signal in a second frequency band;

first circuitry electrically connected to the feeding portion and adapted to communicate with a first object external to the apparatus using the first signal received from the conductive member;

second circuitry electrically connected to the feeding portion and adapted to detect a second object external to the apparatus using the second signal received from the conductive member; and a capacitor formed between the ground portion and a ground of the apparatus, and adapted to electrically open the ground portion with the ground with respect to the second signal, or electrically connect the ground portion with ground with respect to the first signal.

17. The apparatus of the claim 16, further comprising filter circuitry formed between the second circuitry and the feeding portion, the filter circuitry adapted to decouple the second circuitry from the conductive member with respect to the first signal, or couple the second circuitry with the conductive member with respect to the second signal.

18. The apparatus of the claim 16, wherein the capacitor operates as a high-pass filter.

* * * * *